(12) United States Patent
Kim et al.

(10) Patent No.: US 8,461,668 B2
(45) Date of Patent: Jun. 11, 2013

(54) POWER MANAGEMENT INTEGRATED CIRCUIT

(75) Inventors: Jong Min Kim, Seoul (KR); Jae Hyun Yoo, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 57 days.

(21) Appl. No.: 13/111,396

(22) Filed: May 19, 2011

(65) Prior Publication Data
US 2012/0193750 A1 Aug. 2, 2012

(30) Foreign Application Priority Data

Jan. 31, 2011 (KR) .......................... 10-2011-0009517

(51) Int. Cl.
*H01L 21/44* (2006.01)
*H01L 31/70* (2006.01)
*H01L 21/70* (2006.01)

(52) U.S. Cl.
CPC ...................................... *H01L 21/70* (2013.01)
USPC ................... 257/659; 257/500; 257/E23.144; 257/E23.114

(58) Field of Classification Search
CPC ....................................................... H01L 21/44
USPC ..................................... 257/500, 659, E23.114
See application file for complete search history.

(56) References Cited

U.S. PATENT DOCUMENTS

2006/0205102 A1* 9/2006 French et al. .................. 438/30
2009/0166694 A1* 7/2009 Kim .............................. 257/292

FOREIGN PATENT DOCUMENTS

| JP | 2000-031423 | 1/2000 |
| JP | 2008-078486 | 4/2008 |

* cited by examiner

*Primary Examiner* — Nikolay Yushin
(74) *Attorney, Agent, or Firm* — Sherr & Jiang, PLLC

(57) ABSTRACT

A Power Management Integrated Circuit (PMIC) that includes a substrate, a high-side (HS) region on the substrate, a low-side (LS) region spaced from the first region, a device isolation layer interposed between the HS region and the LS region, a metal interconnection connected to the HS region across the device isolation layer and configured to permit a high-voltage current to flow in the HS region, and at least one electric field shield between the metal interconnection and the device isolation layer. Since the electric field shield is disposed under the metal interconnection, a sufficient breakdown voltage can be ensured for the HS region and the LS region.

16 Claims, 4 Drawing Sheets

POWER MANAGEMENT INTEGRATED CIRCUIT

CROSS-REFERENCE TO RELATED APPLICATIONS

The present application claims priority under 35 U.S.C. §119 to Korean Patent Application No. 10-2011-0009517, filed Jan. 31, 2011, which is hereby incorporated by reference in its entirety.

BACKGROUND

Generally, a Power Management Integrated Circuit (PMIC) includes a High-Side (HS) region and a Low-Side (LS) region in accordance with voltages applied to the regions of the PMIC. The HS region and the LS region are electrically insulated by a device isolation layer. In such a PMIC, a voltage or a current is applied through a metal interconnection crossing over an HS region and an LS region. Also, a predetermined amount of a parasite current and a breakdown voltage between the HS region and the LS region needs to be obtained based on an operating voltage while an arbitrary voltage is applied to a predetermined region of the PMIC or a predetermined region of the PMIC is grounded to allow the PMIC to operate normally. In a state where an arbitrary voltage or a ground voltage is applied to a predetermined region of the PMIC, a breakdown voltage and a parasite current between the HS and LS regions should be higher than predetermined values as compared with an operating voltage so as to ensure stable operations of the PMIC.

When an operating voltage of a related-art PMIC is considerably high, however, an electric field is generated between a metal interconnection and a device isolation layer. Consequently, a sufficient operating voltage is not ensured due to a parasite current and a breakdown voltage.

SUMMARY

The present disclosure relates to a PMIC, and more particularly, to an electrical isolation structure between an HS region and an LS region of a PMIC.

Embodiments provide a Power Management Integrated Circuit (PMIC) having an enhanced operating reliability between an HS region and an LS region.

In accordance with embodiments, a PMIC includes at least the following: a substrate; a first region on and/or over the substrate; a second region spaced from the first region by a device isolation layer; a metal interconnection connected to the first region across the device isolation layer to allow a high-voltage current to flow in the first region; and at least one electric field shield between the metal interconnection and the device isolation layer.

DRAWINGS

Figure 1:
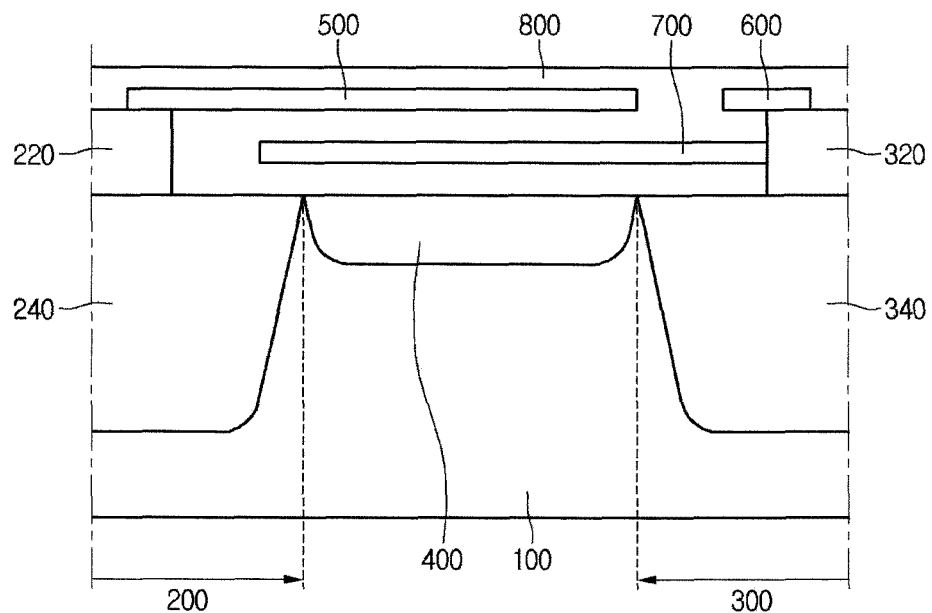

Example FIG. 1 is a sectional view illustrating a Power Management Integrated Circuit (PMIC) in accordance with embodiments.

Figure 2:
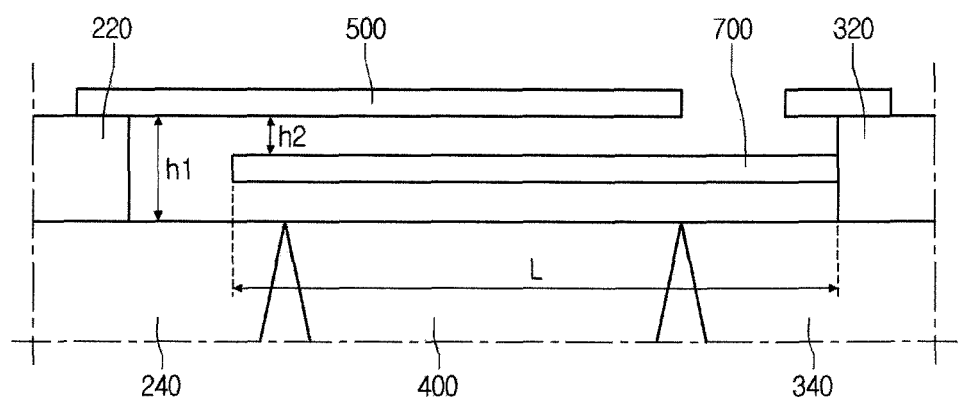

Example FIG. 2 is a sectional view mainly illustrating an electric field shield of the PMIC in accordance with embodiments.

Figure 3:
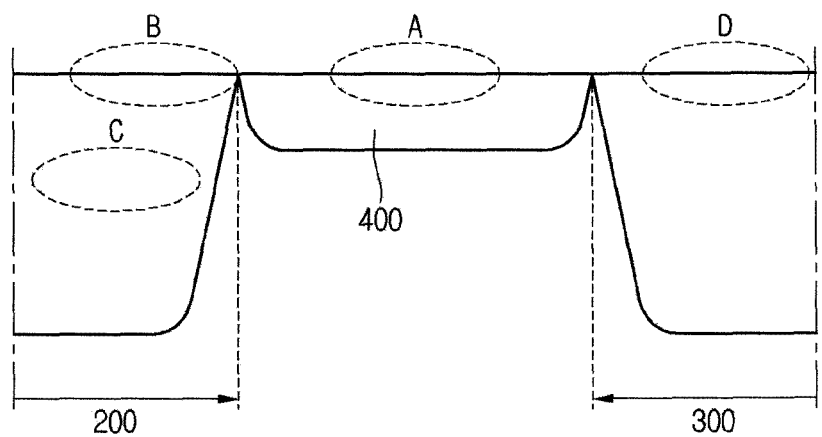

Example FIG. 3 is a sectional view illustrating a region of the PMIC where an induced current appears in accordance with embodiments.

Figure 4:
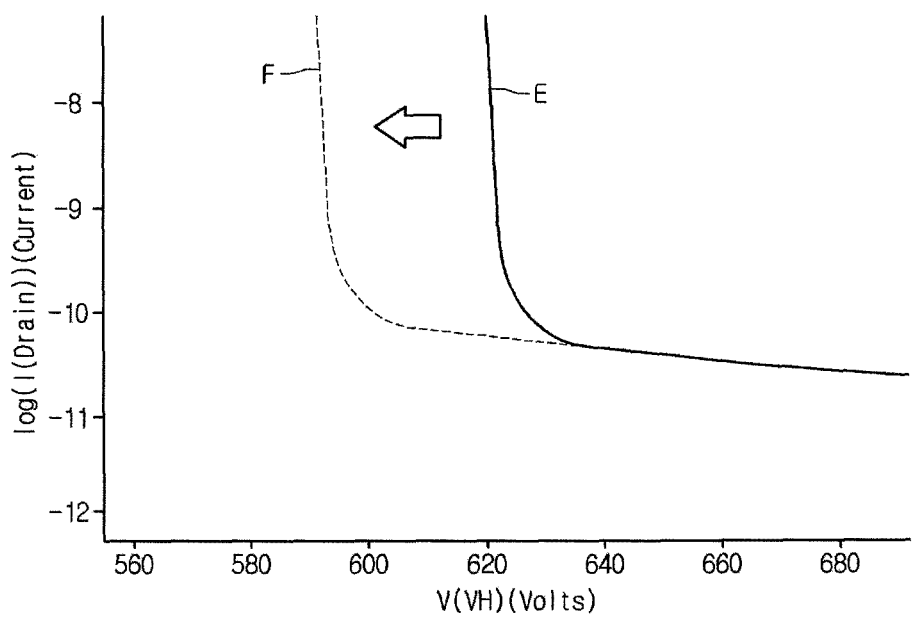

Example FIG. 4 is a graph illustrating an operating voltage in an on-state of the PMIC in accordance with embodiments.

Figure 5:
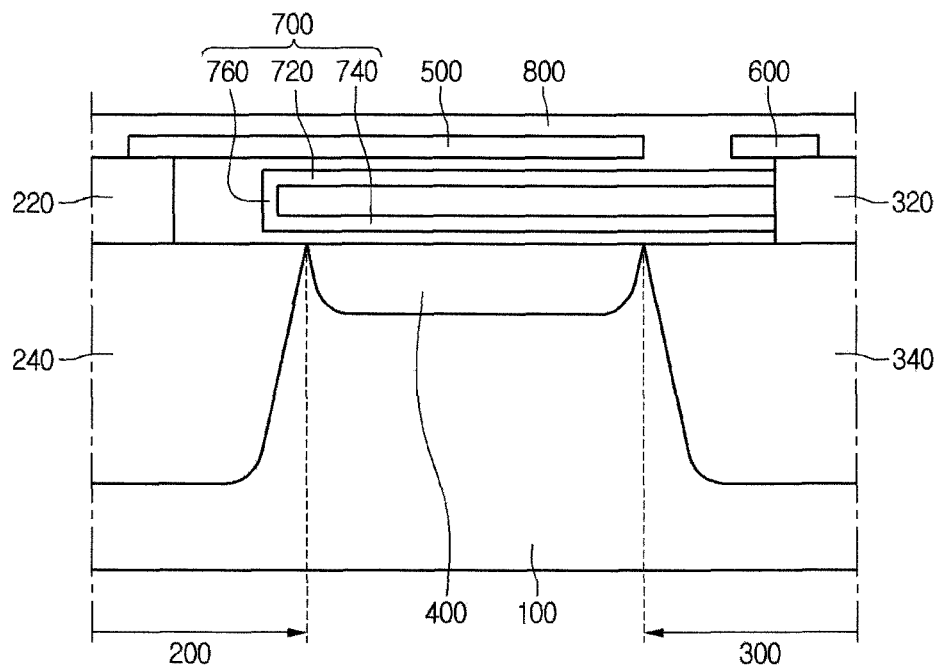

Example FIG. 5 is a graph illustrating an operating voltage in an off-state of the PMIC in accordance with embodiments.

Figure 6:
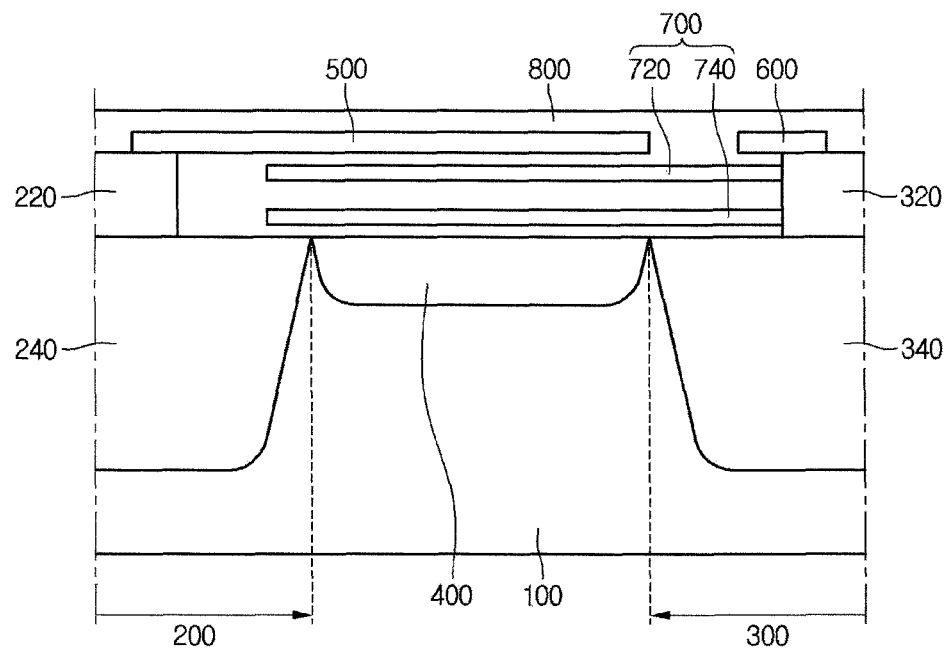
Figure 7:
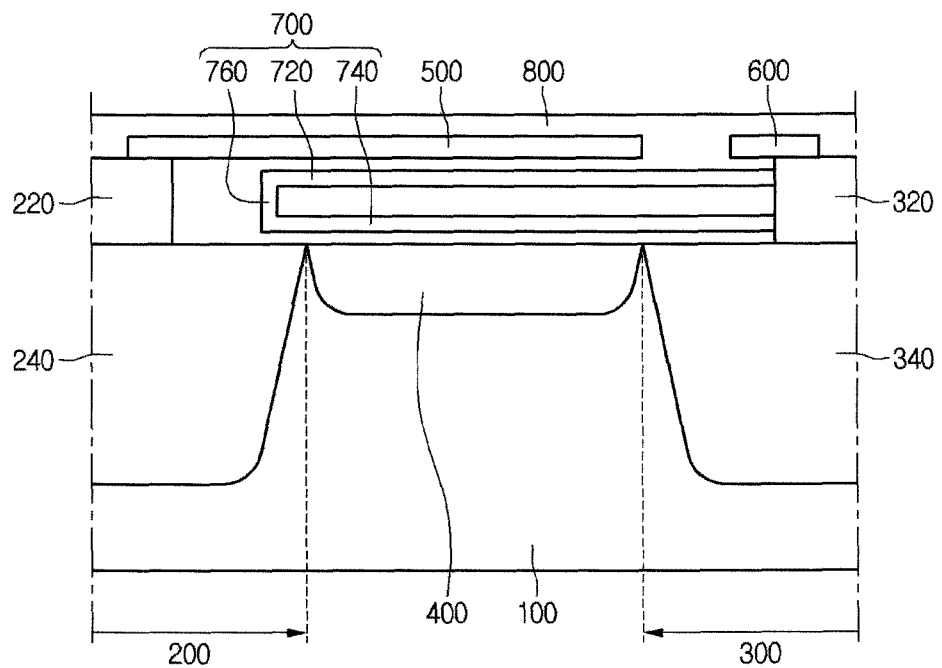
Figure 8:
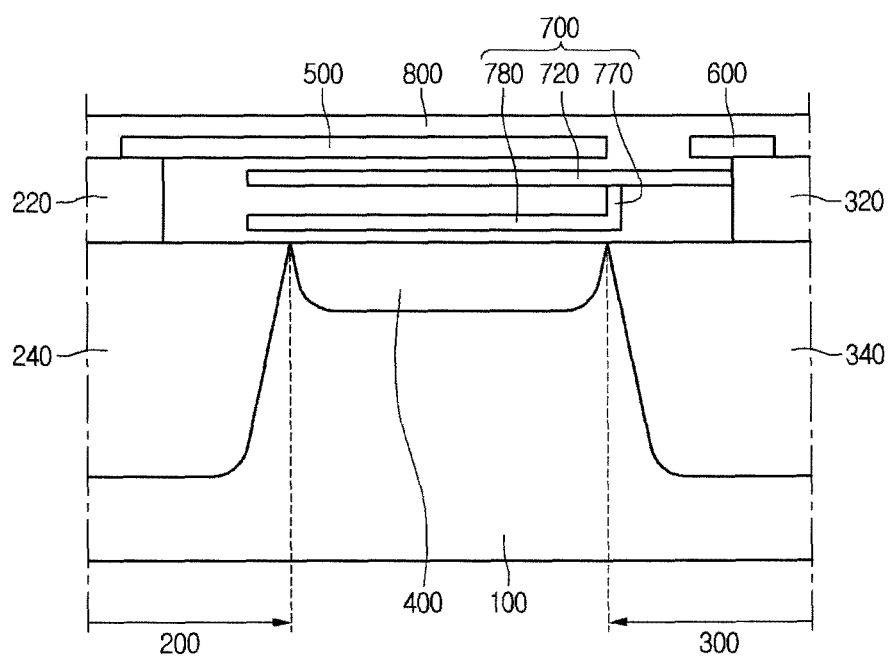

Example FIGS. 6 through 8 are sectional views illustrating modification examples of the PMIC in accordance with embodiments.

DESCRIPTION

Reference will now be made in detail to the embodiments of the present disclosure, examples of which are illustrated in the accompanying drawings.

Hereinafter, a power management integrated circuit will be described according to embodiments with reference to the accompanying drawings.

Example FIG. 1 is a sectional view illustrating a PMIC in accordance with embodiments. Example FIG. 2 is a sectional view mainly illustrating an electric field shield of the PMIC in accordance with embodiments. Example FIG. 3 is a sectional view illustrating a region of the PMIC where an induced current appears in accordance with embodiments. Example FIG. 4 is a graph illustrating an operating voltage in an on-state of the PMIC in accordance with embodiments. Example FIG. 5 is a graph illustrating an operating voltage in an off-state of the PMIC in accordance with embodiments. Example FIGS. 6 through 8 are sectional views illustrating modification examples of the PMIC in accordance with embodiments.

Referring to example FIGS. 1 and 2, the PMIC in accordance with embodiments includes substrate 100, High-Side (HS) region 200 formed on and/or over substrate 100 and Low-Side (LS) region 300 formed on and/or over substrate 100 spaced apart from HS region 200. Device isolation layer 400 is interposed between HS region 200 and LS region 300. First metal interconnection 500 is connected to HS region 200 spatially across device isolation layer 400 to allow a high-voltage current to flow in HS region 200. Electric field shield 700 is formed between metal interconnection 500 and device isolation layer 400.

In accordance with embodiments, substrate 100 may be a p-type wafer (P-SUB) including an n-type buried layer (n-buried layer, NBL) and a p-type epitaxial layer (p-epitaxial layer, PBL).

HS region 200 is formed at one side of substrate 100. In HS region 200, HS device 220 may be surrounded by n-type well 240. HS region 200 may further include a gate electrode, a gate insulation layer, a source region, a source electrode, a drain region, a drain electrode, a spacer, a p-type well region, and an n-type well region.

LS region 300 is formed at the other side of substrate 100 opposite to HS region 200 in a state where device isolation layer 400 is disposed between HS region 200 and LS region 300. In LS region 300, LS device 320 may be surrounded by n-type well 340. Like HS region 200, LS region 300 may further include a gate electrode, a gate insulation layer, a source region, a source electrode, a drain region, a drain electrode, a spacer, a p-type well region, and an n-type well region.

Device isolation layer 400 is formed to divide the PMIC into HS region 200 and LS region 300. Device isolation layer 400 may have a predetermined width. Device isolation layer 400 may be a Local Oxidation of Silicon (LOCOS) layer. If device isolation layer 400 has a sub micron size, device isolation layer 400 may have a Shallow Trench Isolation (STI) structure.

First metal interconnection 500 is connected to HS device 220 to allow a high-voltage current generated in the source region to flow in the drain region. First metal interconnection 500 is formed from the source region and is connected to HS device 220 across and overlapping device isolation layer 400. Here, HS device 220 may be a drain or source terminal. In the same manner, second metal interconnection 600 may be connected from the source region to LS device 320 as a current passage. Here, second metal interconnection 600 may be directly connected to LS device 320 without crossing over device isolation layer 400.

Electric field shield 700 may be formed under first metal interconnection 500 connected to HS device 220. One end of the electric field shield 700 may be connected to LS device 320, and the length L of the electric field shield 700 may cover the entire uppermost surface of device isolation layer 400 and portion of HS region 200. Electric field shield 700 may be formed of a metal, and distance h2 between electric field shield 700 and first metal interconnection 500 may be equal to or less than half distance h1 between first metal interconnection 500 and device isolation layer 400. For example, if distance h1 between first metal interconnection 500 and device isolation layer 400 is 15,000 Å, distance h2 between electric field shield 700 and first metal interconnection 500 may be 7,500 Å. Additionally, electric field shield 700 may be formed at a position spatially corresponding to a position of first metal interconnection 500 and may have a line shape/cross-section or a square plate shape/cross-section.

In accordance with embodiments, HS device 220, LS device 320, first metal interconnection 500, second metal interconnection 600, and electric field shield 700 may be surrounded by insulation layer 800.

As illustrated in example FIG. 3, when the PMIC operates in an on-state, a current flows in first metal interconnection 500 due to a voltage of 700 V applied to HS region 200, and a current flows in electric field shield 700 due to a voltage of 660 V applied to LS region 300. As a result, in regions A, B, and D, a parasite current is not caused by an electric field. In region C, however, a current corresponding to an operating voltage is generated. Similarly, when the PMIC operates in an off-state, a current flows in first metal interconnection 500 due to a voltage of about 40 V, and electric field shield 700 is grounded, so that a parasite current does not occur in regions A, B, and D. A current corresponding to an operating voltage, however, is generated in region C. During such an operating state, it may be possible to ensure a breakdown voltage which is at least equal to or greater than 10% of an operating voltage.

As illustrated in example FIG. 4, in accordance with embodiments, while examining an operating voltage in accordance with the electrical isolation structure of the PMIC having electric field shield 700, if the PMIC operates in an on-state, an operating voltage range F is wider than an operating voltage range E of the related art. Meaning, the PMIC can operate more stably.

As illustrated in example FIG. 5, in accordance with embodiments, when the PMIC operates in an off-state, an operating voltage range F is considerably widened. Accordingly, the electrical isolation structure of the PMIC in accordance with embodiments may significantly enhancing operational reliability.

Although only one electric field shield 700 is formed under first metal interconnection 500 in accordance with embodiments, the scope and spirit of the present disclosure are not limited thereto. Particularly, other structures, such as those illustrated in example FIGS. 6 through 8 are within the scope and spirit of embodiments.

As illustrated in example FIG. 6, in accordance with embodiments, a PMIC includes HS region 200 and LS region 300 spaced apart from each other on and/or over substrate 100 in a state where device isolation layer 400 separates HS region 200 and LS region 300. Metal interconnection 500 is connected to HS device 220 of HS region 200 across the uppermost surface of device isolation layer 400, and electric field shields 700 are formed under metal interconnection 500.

Electric field shields 700 include first electric field shield 720 and second electric field shield 740 which are vertically spaced from each other. Sides of first electric field shield 720 and second electric field shield 740 are connected to LS device 320 of LS region 300. Additionally, the other sides of first electric field shield 720 and second electric field shield 740 may cover device isolation layer 400 and a portion of HS region 200. The lengths of first electric field shield 720 and second electric field shield 740 may correspond to each other. Of course, first electric field shield 720 and second electric field shield 740 may have different lengths. For example, the length of first electric field shield 720 adjacent to metal interconnection 500 may be greater than that of second electric field shield 740.

In accordance with embodiments, while the PMIC is illustrated having two electric field shields 700, the scope and spirit of embodiments are not limited thereto. For example, the PMIC may have three or more electric field shields.

As illustrated in example FIG. 7, in accordance with embodiments, a PMIC includes HS region 200 and LS region 300 spaced from each other on and/or over substrate 100 in a state where HS region 200 and LS region 300 are separated from each other by device isolation layer 400. Metal interconnection 500 is connected to HS device 220 of HS region 200 across device isolation layer 400, and electric field shields 700 are formed under metal interconnection 500.

Electric field shields 700 include first electric field shield 720 and second electric field shield 740 that are vertically spaced from each other. Respective ends of first electric shield 720 and second electric field shield 740 are connected through connection part 760. While first electric field shield 720 and second electric field shield 740 are illustrated being connected at their ends, the scope and spirit of embodiments are not limited thereto. For example, first field shield 720 and second electric field shield 740 may be connected to each other at any other sides thereof.

As illustrated in example FIG. 8, in accordance with embodiments, a PMIC includes HS region 200 and LS region 300 spaced from each other on and/or over substrate 100 in a state where device isolation layer 400 separates HS region 200 and LS region 300. Metal interconnection 500 is connected to HS device 220 of HS region 200 across device isolation layer 400, and electric field shield 700 is formed under metal interconnection 500.

Electric field shield 700 includes first horizontal electric field shield portion 720, vertical electric field shield portion 770 extending downward from first horizontal electric field shield portion 720, and second horizontal electric field shield portion 780 extending from one end of vertical electric field shield portion 770 in parallel with first horizontal electric field shield portion 720. Vertical electric field shield portion 770 is disposed at a side of device isolation layer 400. An end of second horizontal electric field shield portion 780 is connected to vertical electric field shield portion 770, and second horizontal electric field shield portion 780 extends to cover device isolation layer 400 and a portion of HS region 200.

As mentioned above, in accordance with embodiments, the PMIC includes an electric field shield under the metal interconnection where a high-voltage current flows in the HS region. A current, therefore, may not be induced in the device isolation layer due to an electric field generated from the metal interconnection. The electrical isolation structure of the PMIC, consequently, can be more reliable.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

What is claimed is:

1. A Power Management Integrated Circuit (PMIC) comprising:
    a substrate;
    a High-Side (HS) region on the substrate;
    a Low-Side (LS) region spaced from the HS region;
    a device isolation layer interposed between the HS region and the LS region;
    a metal interconnection connected to the HS region across the device isolation layer and configured to permit a high-voltage current to flow in the HS region; and
    at least one electric field shield between the metal interconnection and the device isolation layer;
    a vertical part disposed on a bottom side of the electric field shield; and
    a horizontal part extending from the vertical art to the HS region,
    wherein the horizontal part extends to cover the device isolation layer,
    wherein the horizontal part extends to cover a portion of the HS region.

2. The PMIC of claim 1, wherein the electric field shield is connected to the LS region.

3. The PMIC of claim 1, wherein the electric field shield is disposed at a position corresponding to the metal interconnection.

4. The PMIC of claim 1, wherein the electric field shield extends to cover a portion of the HS region.

5. The PMIC of claim 1, wherein the electric field shield comprises a metal.

6. The PMIC of claim 1, wherein a distance between the metal interconnection and the electric field shield is one of equal to and less than half a distance between the metal interconnection and the device isolation layer.

7. The PMIC of claim 1, wherein the at least one electric field shield comprises a plurality of electric field shields that are vertically spaced from each other.

8. The PMIC of claim 7, further comprising a connection part connecting the plurality of electric field shields.

9. The PMIC of claim 1, wherein the LS region spaced from the HS region by the device isolation layer.

10. An apparatus comprising:
    a substrate having a High-Side (HS) region and a Low-Side (LS) region defined by a device isolation layer;
    an HS device in the HS region;
    an LS device in the LS region;
    a metal interconnection directly on a portion of the HS device and configured to extend across the uppermost surface of the device isolation layer;
    an electric field shield under the metal interconnection, the electric field shield comprising a first electric field shield portion, a second electric field portion shield spatially spaced vertically from the first electric field shield portion, and a third electric field shield portion configured to connect the first electric field shield portion to the second electric field shield portion.

11. The apparatus of claim 10, wherein respective first ends of the first electric shield portion and the second electric field shield portion are connected through the third electric field shield portion.

12. The apparatus of claim 10, wherein respective second ends of the first electric shield portion and the second electric field shield portion are connected to and extend from the LS device.

13. The apparatus of claim 10, wherein the apparatus comprises a Power Management Integrated Circuit.

14. An integrated circuit comprising:
    a substrate;
    a High-Side (HS) region having an HS device therein;
    a Low-Side (LS) region spaced from the HS region and having an LS device therein;
    a device isolation layer interposed between the HS region and the LS region;
    a metal interconnection directly on the uppermost surface of the HS device;
    an electric field shield disposed under the metal interconnection and extending across the entire device isolation layer and a portion of the HS region and a portion of the LS region,
    wherein the electric field shield includes a first electric field shield portion connected at a first end thereof to the LS device, a second electric field shield portion spatially spaced vertically from and extending in parallel to the first electric field shield portion, and a third electric field shield connection portion connected between a first end of the second electric field shield portion and the first electric field shield portion.

15. The integrated circuit of claim 14, wherein the second electric field shield portion extends to cover the device isolation layer and a portion of the HS region.

16. The integrated circuit of claim 14, wherein the integrated circuit comprises a Power Management Integrated Circuit.

* * * * *